United States Patent
Yotsutani

[19]

[11] Patent Number: 6,109,931
[45] Date of Patent: Aug. 29, 2000

[54] CF CARD ADAPTER

[75] Inventor: Kenichi Yotsutani, Tokyo, Japan

[73] Assignee: Honda Tsushin Kogyo Co., Ltd., Meguro-ku, Japan

[21] Appl. No.: 09/287,094

[22] Filed: Apr. 7, 1999

[30] Foreign Application Priority Data

Jan. 22, 1999 [JP] Japan .................................. 11-014108

[51] Int. Cl.⁷ .................................................. H05K 1/00
[52] U.S. Cl. ......................... 439/76.1; 439/945; 439/946; 361/737; 361/753
[58] Field of Search .................................. 439/76.1, 76.2, 439/945, 946, 947; 361/727, 737, 753, 684

[56] References Cited

U.S. PATENT DOCUMENTS

| | | | |
|---|---|---|---|
| 5,660,568 | 8/1997 | Moshayedi | 439/945 X |
| 5,752,857 | 5/1998 | Knights | 439/945 X |
| 5,846,092 | 12/1998 | Feldman et al. | 439/76.1 |
| 5,902,137 | 5/1999 | Yodogawa | 439/76.1 |

*Primary Examiner*—Stanley J. Witkowski
*Attorney, Agent, or Firm*—Arent Fox Kintner Plotkin & Kahn PLLC

[57] ABSTRACT

Disclosed is an improved CF card adapter comprising a synthetic resin frame, upper and bottom metal covers attached to the synthetic resin frame, a CF card receptacle formed on the rear side of the synthetic resin frame, a pin header having pin contacts exposed on its rear side; a printed circuit board whose printed circuit is connected to the pin contacts of the pin header, and a female receptacle connector part formed on the front side of the adapter body. The female receptacle connector part is electrically connected to the printed circuit, and is adapted to be inserted in the PC card slot of an electric or electronic device. One of the upper and bottom metal covers has grounding pieces integrally connected to the length round the outside of the rectangular metal sheet. These grounding pieces are CF card grounding pieces, printed circuit grounding pieces, and grounding pieces to the PC card slot and the other metal cover.

2 Claims, 4 Drawing Sheets

CF CARD ADAPTER

BACKGROUND OF THE INVENTION

1. Field of the Invention

The present invention relates to a card adapter for use in a personal computer or the like, the capabilities of which can be expanded by using PC cards, and more particularly to a CF card adapter which makes it possible to increase the relatively small size of a CF card ("compact flush" card abbreviated as such) to be apparently equal to the relatively large size of a PC card, thereby permitting the small-sized card to be snugly inserted and mated with the card receptacle of the personal computer or the like.

2. Description of Related Art

As is well known, CF cards are used in digital phones, digital cameras, LAN devices or modems via associated I/O connectors, and are often used as memories. Such CF cards are small, compared with PC cards, and therefore, personal computers must be equipped with extra intervenient or interface connectors to be used exclusively for such small-sized cards. Referring to FIG. 15, an adapter 1a is used for permitting an electronic device 11 to accommodate a CF card 10 indirectly. Specifically, the small-sized card 10 is inserted and mated with the adapter 1a, thereby making the small-sized card 10 to be as large as the PC card. Then, the CF card 10 can be used in a personal computer 11 by inserting the adapter 1a having the CF card 10 press-fitted therein into the receptacle 11a of the personal computer 11.

The CF card adapter 1a is equipped with grounding pieces for making an electric connection to the grounding metal strip surrounding the CF card 10. Such grounding pieces, however, are separate metal pieces, and therefore, they must be fixed to the synthetic resin frame of the adapter 1a. Likewise, some grounding pieces for making an electric connection between the printed circuit board of the CF card adapter 1a and the PC card slot or receptacle of an electronic device are separate metal pieces.

These separate metal pieces must be assembled into a CF adapter, and accordingly the number of assembling steps and the manufacturing cost are increased.

SUMMARY OF THE INVENTION

In view of the above one object of the present invention is to provide a CF card adapter which can establish all required groundings without recourse to separate parts.

To attain this object a CF card adapter comprising a synthetic resin frame, upper and bottom metal covers attached to the synthetic resin frame, a CF card receptacle formed on the rear side of the synthetic resin frame, a pin header having a plurality of pin contacts exposed on its rear side; a printed circuit board whose printed circuit is connected to the pin contacts of the pin header, and a female receptacle connector part formed on the front side of the adapter body, the female receptacle connector part being electrically connected to the printed circuit and adapted to be inserted in the PC card slot of an electric or electronic device, is improved according to the present invention in that one of the upper and bottom metal covers has the following grounding pieces integrally connected thereto: CF card grounding pieces, printed circuit grounding pieces, and grounding pieces to the PC card slot and the other metal cover.

The synthetic resin frame may have one of the upper and bottom metal covers incorporated therein, and the synthetic resin frame may have means for permitting the other metal cover to be press-fitted and caught thereby.

Integral connection of different grounding pieces to one of the two metal covers permits the number of parts to be assembled, and hence the amount of control work to be reduced. Also advantageously, different grounding pieces can be fixed to the adapter body in correct positions automatically when the metal cover having all grounding pieces integrally connected thereto is attached to the adapter body.

Other objects and advantages of the present invention will be understood from the following description of a CF card adapter according to one preferred embodiment of the present invention, which is shown in accompanying drawings.

DESCRIPTION OF THE PREFERRED EMBODIMENTS

Referring to FIGS. 1 to 5, a CF card adapter 1 comprises an adapter body 5, which is composed of a synthetic resin frame 2 having top and bottom metal covers 3 and 4 applied to its top and bottom surfaces.

Figure 15:
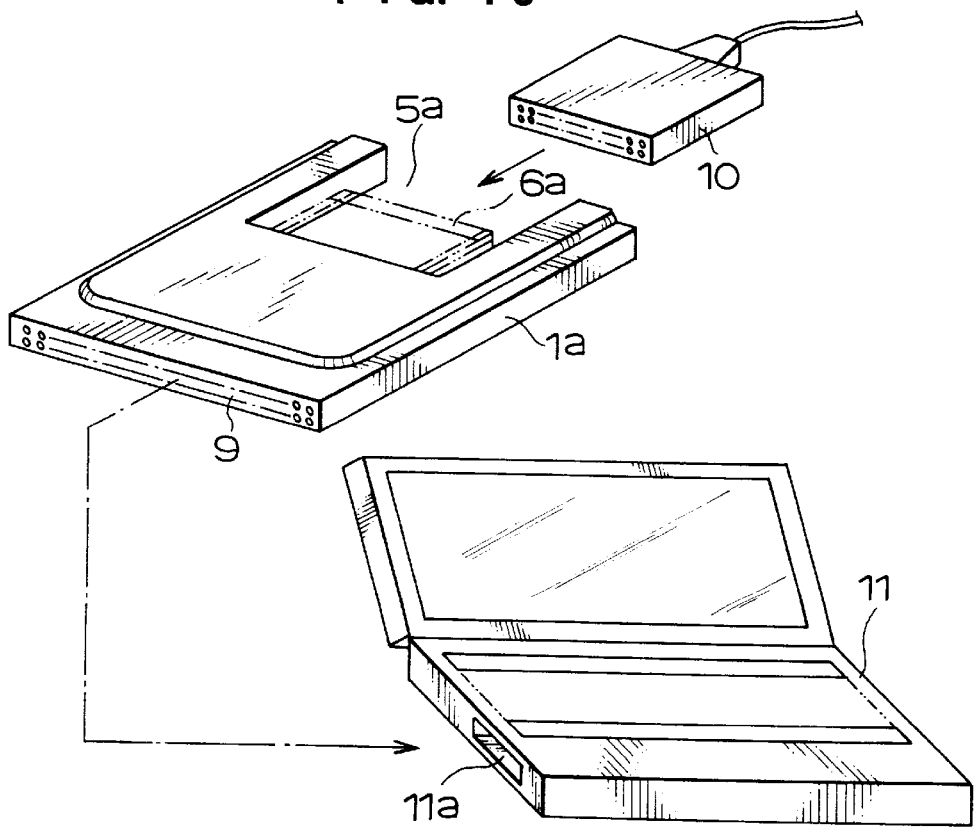
FIG. 15 shows how a CF card adapter is used in applying a CF card to an electronic device.

The adapter body 5 has a CF card receptacle space 5a defined by the opposite rear extensions 2a and 2b of the frame 2 and the rear area of the bottom cover 4. A pin header 7 has a plurality of pin contacts 6 embedded therein, allowing their front and rear portions exposed. The pin header 7 is fitted in the frame 2 with the rear portions 6a appearing in the CF card receptacle space 5a. A printed circuit board 8 is fitted in the frame 2 ahead of the pin header 7, allowing the front portions of the pin contacts 6 to be inserted in the female receptacles of the printed circuit board 8 thereby to make electric connections to selected conductors of the printed circuit. Finally, a receptacle connector 9 is fixed to the front end of the adapter body 5, permitting insertion of the CF card adapter 1 into the PC card slot 11a of a mobile personal computer 11, as seen from FIG. 15.

The top metal cover 3 has grounding pieces integrally connected to the length round the outside of the rectangular metal sheet. It includes grounding pieces 3a for grounding a CF card 10 to be inserted in the adapter 1 (see FIGS. 5 and 6A–C), grounding pieces 3b for grounding the printed circuit 8 (see FIGS. 7, 8 and 14), grounding pieces 3c for grounding the PC card slot 11a (see FIGS. 9, 10, 11 and 15) and grounding pieces 3d for grounding the bottom metal cover 4 (FIG. 10).

Referring to FIGS. 5 and 6A–C, the CF card grounding pieces 3a bulge out from the opposite rear extensions of the top metal cover 3. When a CF card 10 is inserted in the receptacle space 5a of the adapter body 5, the grounding strips of the opposite sides of the CF card 10 are put in contact with the grounding pieces 3a, thus establishing an electric connection between the grounding strips of the CF card 10 and the top metal cover 3 of the adapter Referring to FIGS. 7 and 8, the printed circuit grounding pieces 3b project from the opposite longitudinal sides of the top metal cover 3 intermediate the front and rear ends of the top metal cover 3 to reach the grounding conductors of the printed circuit board 8 (See FIG. 14). These grounding pieces 3b are formed by bending the intermediate flaps of the opposite longitudinal sides of the top metal cover 3.

Figure 9:
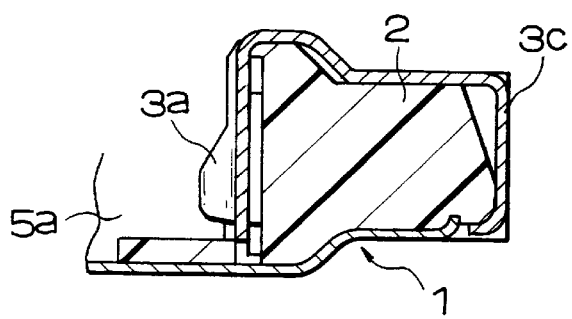
FIG. 9 is a sectional view of the adapter taken along the line 9—9 in FIG. 1.
Figure 10:
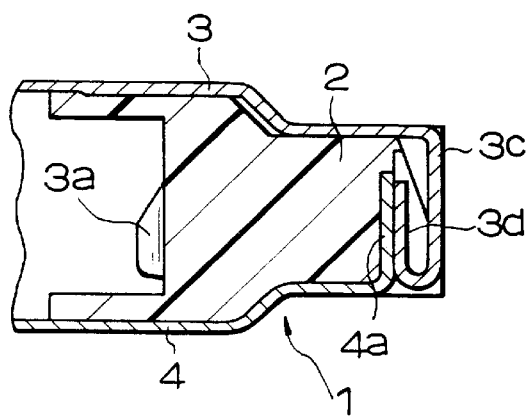
FIG. 10 is a sectional view of the adapter taken along the line 10—10 in FIG. 1.
Figure 11:
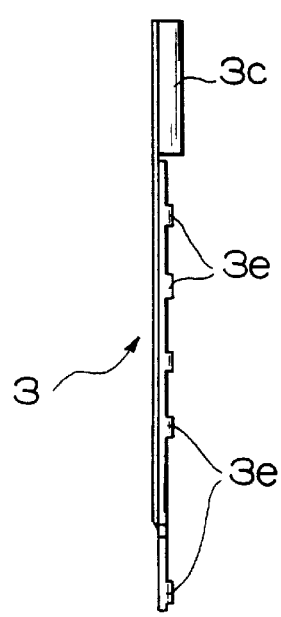
FIG. 11 is a side view of the top cover of the adapter.

Referring to FIGS. 9, 10 and 11, the PC card slot grounding pieces 3c are formed by bending the rear, lateral strips of the opposite longitudinal sides of the top metal cover 3, thus partially covering the opposite sidewalls of the frame 2. When the adapter 1 is inserted in the PC card slot 11a of the mobile personal computer 11, the grounding strips (not shown) of the opposite sides of the PC card slot 11a are put in contact with the grounding pieces 3c.

Finally, referring to FIG. 10, the bottom metal cover grounding pieces 3d are formed by bending inward the rear, lateral extensions of the opposite longitudinal sides of the top metal cover 3 into the letter of "U". One leg of the "U"-shaped grounding piece 3c is pushed against the rear, upright extension 4a of either longitudinal side of the bottom metal cover 4, thus making a required electric connection between the top and bottom metal plates 3 and 4.

As may be understood from the above, all grounding pieces 3a, 3b, 3c and 3d are integrally connected to the top metal cover 3. Conversely, these grounding pieces 3a, 3b, 3c and 3d may be integrally connected to the bottom metal cover 4.

Figure 7:
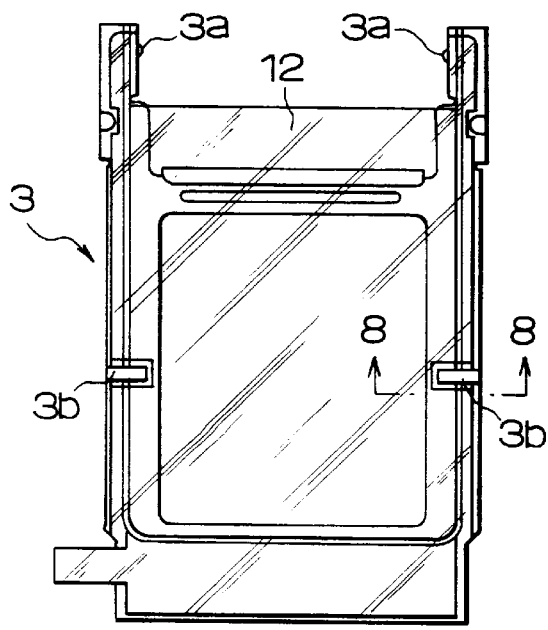
FIG. 7 is a plane view of the top cover of the adapter.
Figure 8:
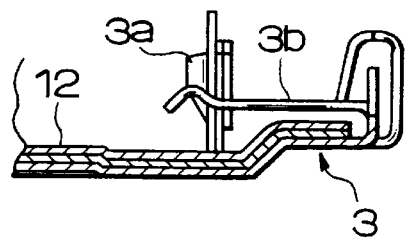
FIG. 8 is a sectional view of the top cover taken along the line 8—8 in FIG. 7.

As seen from FIG. 7, the top metal cover 3 has an adhesive tape 12 applied to its inner surface, thereby insulating the top metal cover 3 from the underlying printed circuit board 8 and electric connections. The adhesive tape 12 has a separator tab attached thereto.

As seen from FIG. 11, the top metal cover 3 has upright engagement projections 3e formed on its opposite longitudinal sides.

Figure 12:
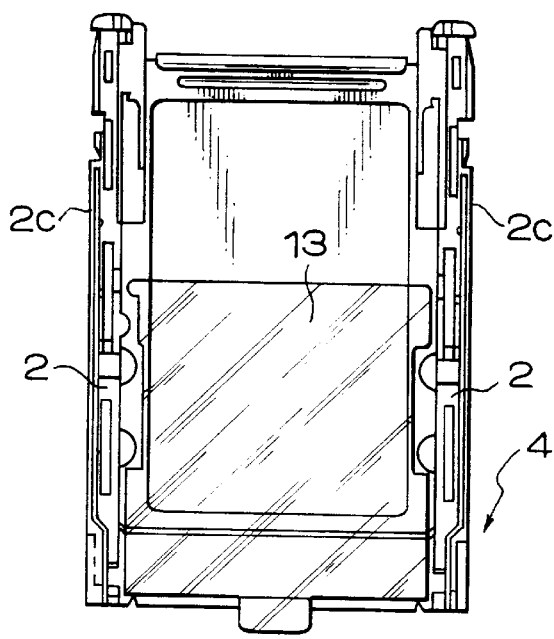
FIG. 12 is a plane view of the bottom cover of the adapter.
Figure 13:
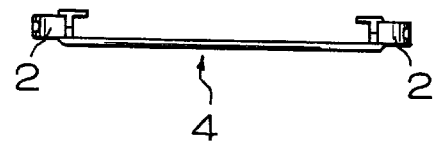
FIG. 13 is an end view of the bottom cover.

Referring to FIGS. 12 and 13, the bottom cover 4 and the synthetic resin frame 2 are formed as a whole by using an appropriate metal mold. The so molded frame 2 has engagement grooves 2c to catch the engagement projections 3e of the top metal cover 3.

The bottom metal cover 4 has an adhesive tape 13 applied to one half of the inner surface of the cover, thereby insulating the bottom metal cover 4 from the overlying printed circuit board 8 and electric connections. The adhesive tape 13 has a separator tab attached thereto.

Figure 1:
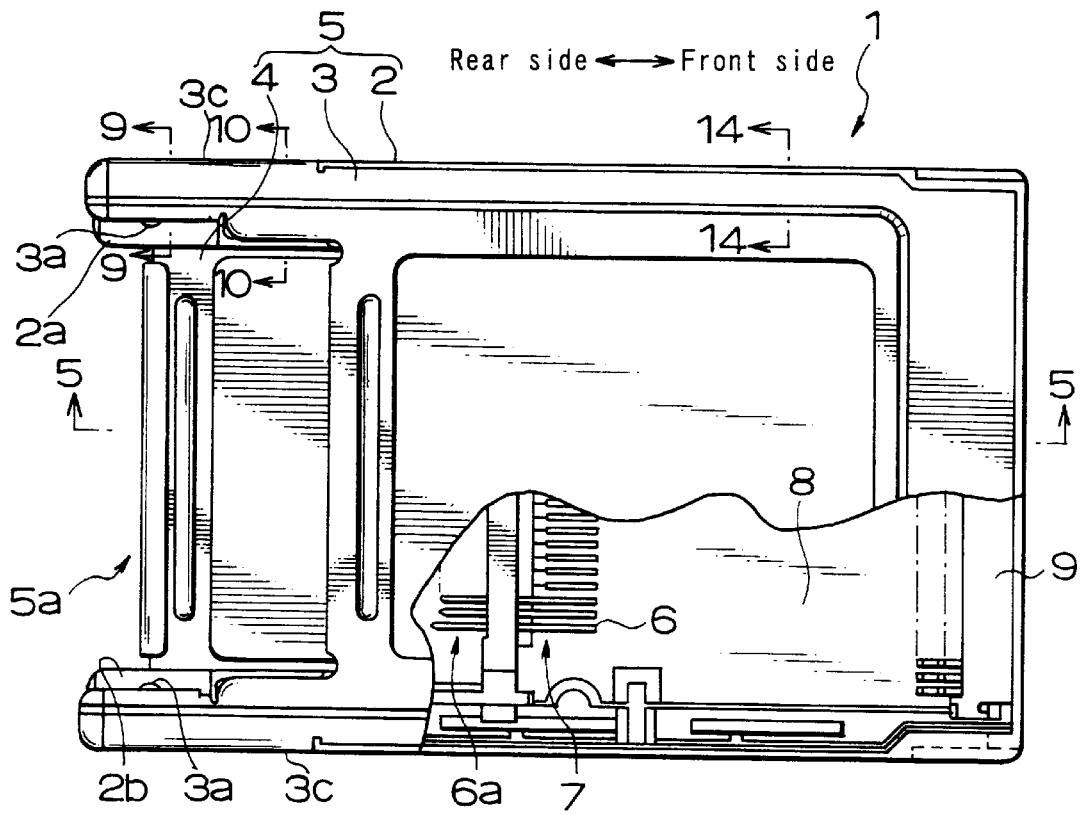
FIG. 1 is a plane view of a CF card adapter according to the present invention, shown partly broken.
Figure 2:
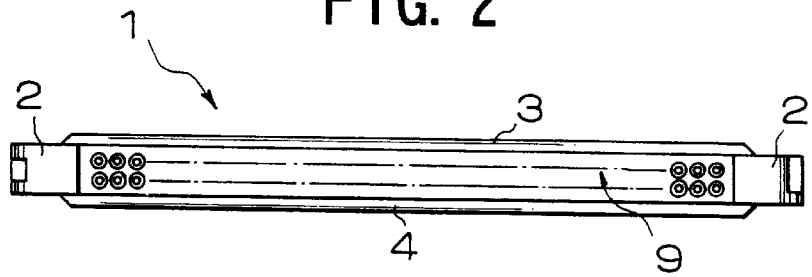
FIG. 2 is a front view of the CF card adapter.
Figure 3:
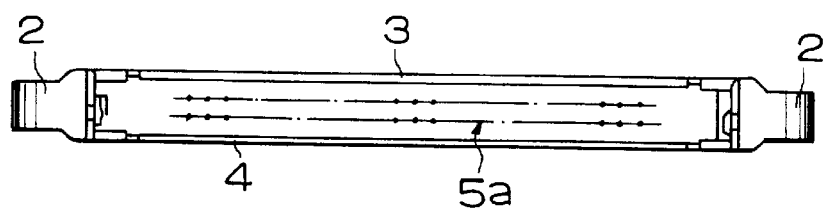
FIG. 3 is a rear view of the CF card adapter.
Figure 4:
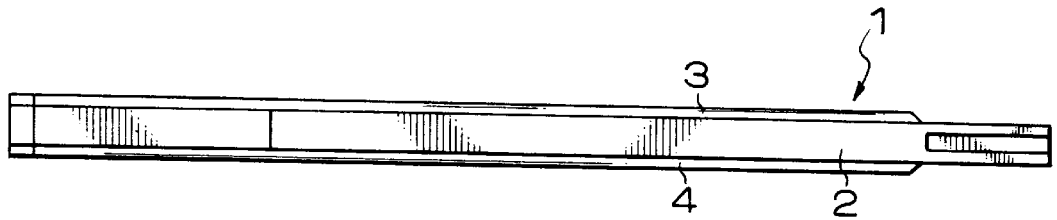
FIG. 4 is a side view of the CF card adapter.
Figure 5:
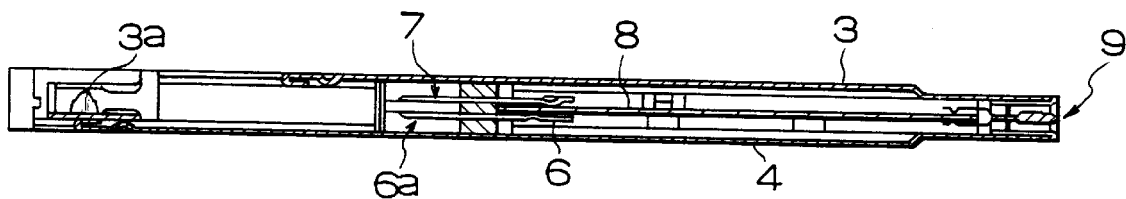
FIG. 5 is a longitudinal section of the CF card adapter taken along the line 5—5 in FIG. 1.
Figures 6A, 6B, 6C:
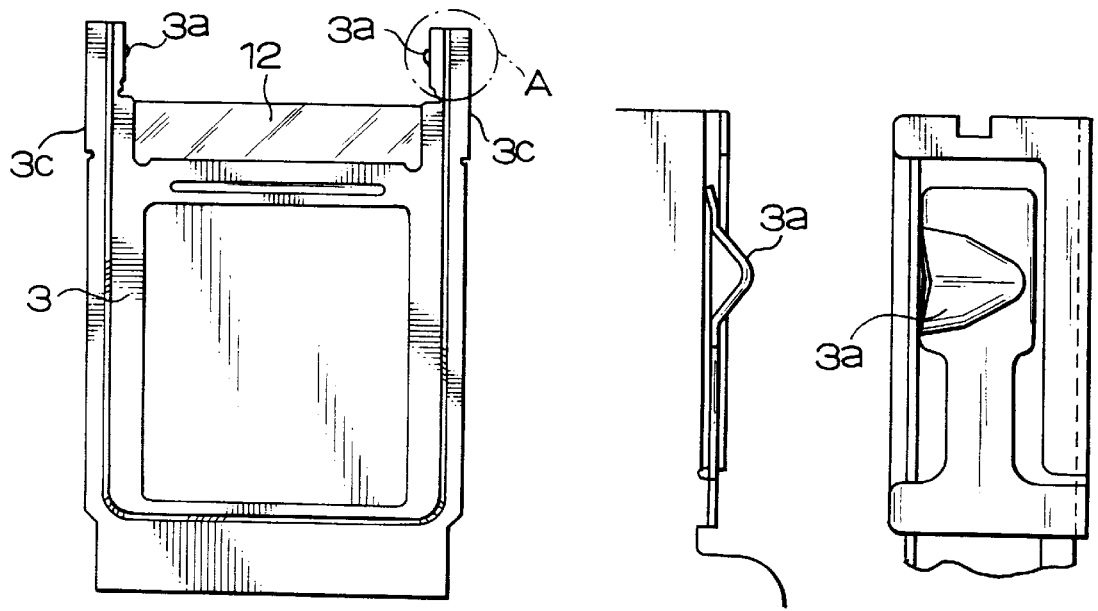
FIG. 6A is a plane view of the top cover of the adapter.
FIGS. 6B and 6C are enlarged side and plane views of the encircled portion "A" in FIG. 6A.

When the parts are assembled to a CF card adapter 1, the pin header 7, the printed circuit board 8 and the receptacle connector are press-fitted in the bottom cover-and-synthetic resin frame 2, and then, the top metal cover 3 is applied to the frame 2 with the upright engagement projections of the top metal cover 3 inserted in the engagement grooves 2c of the frame 2. Thus, the CF card adapter 1 results as shown in FIG. 1.

Figure 14:
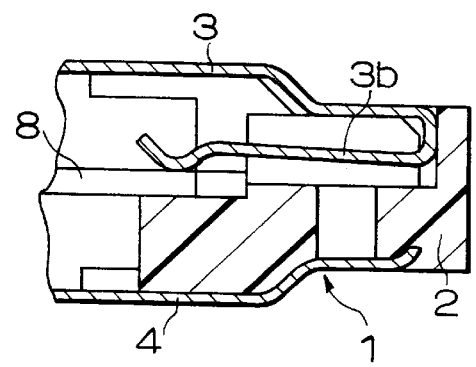
FIG. 14 is a sectional view of the adapter taken along the line 14—14 in FIG. 1.

In the assembly the CF card grounding pieces 3a appear in the CF card receptacle space 5a (see FIG. 7); the PC card slot grounding pieces 3c appear on the surrounding surface of the frame 2 (see FIG. 11); the bottom cover grounding pieces 3d abut on the bottom metal cover 4 (FIG. 10); and the printed circuit board grounding pieces 3b abut on the grounding pads of the printed circuit board 8 (FIG. 14).

In use a CF card 10 is inserted in the receptacle space 5a of the adapter 1, thus permitting the CF card 10 to be held and grounded by the grounding pieces 3a of the adapter 1, and the adapter 1 is inserted in the PC card slot 11a of the mobile personal computer 11, thereby permitting the printed circuit board 8 and the receptacle connector 9 to be grounded to the mobile personal computer 11 through the agencies of the grounding pieces 3b, 3c and 3d while the printed circuit is being electrically shielded the top and bottom metal covers 3 and 4.

As may be understood from the above, all grounding pieces are integrally connected to one of the top and bottom metal covers, not constituting separate parts, and the one metal cover is integrally connected to the synthetic resin frame by insert-molding. Thus, the number of the parts to be assembled is reduced, and accordingly the number of the assembling steps is reduced. Also, advantageously the control operation of parts to be assembled is less laborious. These lead to significant reduction of manufacturing cost.

What is claimed is:

1. A CF card adapter comprising a synthetic resin frame, upper and bottom metal covers attached to the synthetic resin frame, a CF card receptacle formed on the rear side of the synthetic resin frame, a pin header having a plurality of pin contacts exposed on its rear side; a printed circuit board whose printed circuit is connected to the pin contacts of the pin header, and a female receptacle connector part formed on the front side of the adapter body, the female receptacle connector part being electrically connected to the printed circuit and adapted to be inserted in the PC card slot of an electric or electronic device, wherein at least one of the upper and bottom metal covers has the following grounding pieces integrally connected thereto: CF card grounding pieces, printed circuit grounding pieces, and grounding pieces to the PC card slot and the other metal cover.

2. A CF card adapter according to claim 1 wherein the synthetic resin frame has one of the upper and bottom metal covers incorporated therein as a whole, and the synthetic resin frame has means for permitting the other metal cover to be press-fitted and caught thereby.

* * * * *